June 2, 1964 G. B. HERZOG 3,135,920

FREQUENCY CONTROLLED OSCILLATOR

Filed Oct. 12, 1959

INVENTOR.

Gerald B. Herzog

BY

Eugene M. Whitacre

ATTORNEY

3,135,920
FREQUENCY CONTROLLED OSCILLATOR

Gerald Bernard Herzog, Princeton, N.J., assignor to Radio Corporation of America, a corporation of Delaware Filed Oct. 12, 1959, Ser. No. 845,773
14 Claims. (Cl. 325—420)

This invention relates to electrical oscillation generator circuits and more particularly to oscillation generator circuits of the type in which the frequency of oscillation can be controlled by a suitable electrical control signal.

Frequency controlled oscillator circuits have many uses in electronic apparatus. For example, oscillators of this type may be used as the exciter or modulator of an FM transmitter, wherein the frequency of the transmitter oscillator is caused to deviate from a preselected center frequency as a function of the amplitude and polarity of a modulating signal. Frequency control oscillators may also be used as the local oscillator in superheterodyne receivers, wherein the frequency of oscillation is controlled by an automatic frequency control (AFC) voltage so that the receiver intermediate frequency (I.-F.) is maintained at the proper frequency.

In general, known types of frequency controlled oscillator circuits include: an amplifying device as the active oscillator element; tuning circuits for tuning the oscillator to a desired center frequency; and a control signal responsive variable reactance element coupled with the tuning circuits to control the frequency of oscillation. Such circuits are not only complex to build and adjust, but are subject to the disadvantage that the variable reactance element is usually decoupled from the rest of the oscillator circuit to prevent excessive loading of the oscillator, thereby reducing the sensitivity of frequency control.

It is an object of the present invention to provide an improved frequency controlled oscillation generator.

Another object of this invention is to provide an improved frequency controlled oscillation generator which requires relatively few component parts and is simple to build and adjust.

A further object of this invention is to provide an improved frequency controlled oscillator circuit having a high frequency sensitivity to the applied controlling signal.

In accordance with the invention, a negative resistance diode is biased to exhibit a stable negative resistance. The diode is connected to a suitable inductive tuning element which resonates with the diode capacitance. Under certain conditions the tunnel diode mounting structure, and lead conductors therefor, may comprise the inductive tuning element. The total positive conductance of the loading circuit appearing across the diode is selected to be less than the absolute value of the negative resistance of the diode so that the circuit will oscillate, the frequency of oscillation being determined by the resonant frequency of the tuned circuit including the inductive tuning element and the diode. A suitable control voltage, which may, for example, be and AFC voltage, is applied to the diode to control the precise biasing point in the negative resistance region of the diode operating characteristic. A change in biasing voltage causes the diode interelectrode capacitance to vary and shifts the frequency of resonance of the tuned circuit, thereby changing the frequency of oscillation.

The novel features which are considered to be characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 1:
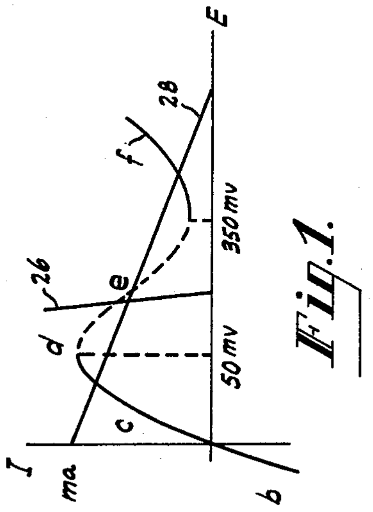
FIGURE 1 is a graph illustrating the voltage-current characteristic of a negative resistance diode suitable for use in circuits embodying the invention.

A negative resistance diode suitable for use in circuits embodying the invention is described by H. S. Sommers in the Proceeding of the IRE, July 1959, page 1202–1205. The current-voltage characteristics of a typical voltage-controlled negative resistance diode is shown in FIGURE 1. The current scales depend on the area and doping of the junction of the diode electrodes, but representative currents are in the milliampere range. For a small voltage in the back direction, the back current of a diode increases as a function of voltage as is indicated by the region *b* of FIGURE 1.

For small forward bias voltages, the characteristic is substantially symmetrical (FIGURE 1, region *c*). The small forward current is believed to exist due to quantum mechanical tunneling. At higher forward bias voltages, about 50 millivolts (mv.), the forward current believed to exist due to tunneling reaches a maximum (region *d*, FIGURE 1), and then begins to decrease. This drop continues (FIGURE 1, region *e*) until eventually, at about 350 mv., it is believed that normal injection over the barrier becomes important and, whatever the cause, the characteristic turns into the usual forward behavior (region *f*, FIGURE 1).

Figure 2:
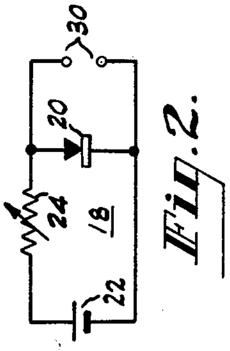
FIGURE 2 is a schematic circuit diagram of a D.-C. biasing circuit for the diode of FIGURE 1.

The negative resistance of the diode is the incremental change in voltage divided by the incremental change in current, or the reciprocal slope of the region *e* of FIGURE 1. To bias the diode for stable operation in the negative resistance region of its characteristic requires a suitable voltage source having a smaller internal impedance than the negative resistance of the diode. As shown in FIGURE 2, the voltage source 18 may comprise a battery 22 and a variable resistor 24, with the internal resistance of the source being the sum of the internal resistance of the battery 22 and the adjusted resistance of the variable resistor 24. Such a voltage source has a D.-C. load line 26, as indicated in FIGURE 1, which is characterized by a current-voltage relationship which has a greater in absolute value slope than the negative slope of the diode characteristic, and intersects the diode characteristic at only a single point. If the voltage source 18 has an internal resistance which is greater than the resistance of the diode, the source would have a load line 28 with a smaller slope than the negative slope of the diode characteristic and would intersect the diode curve at three points. Under the latter condition, the diode is not stably biased in the negative resistance region. This is because an incremental change in current through the diode due to transient or noise currents, or the like, produces a regenerative reaction which causes the diode to assume one of its two stable states as represented by the intersection of the load line 28 with the positive resistance portions of the diode curve.

Figure 3:
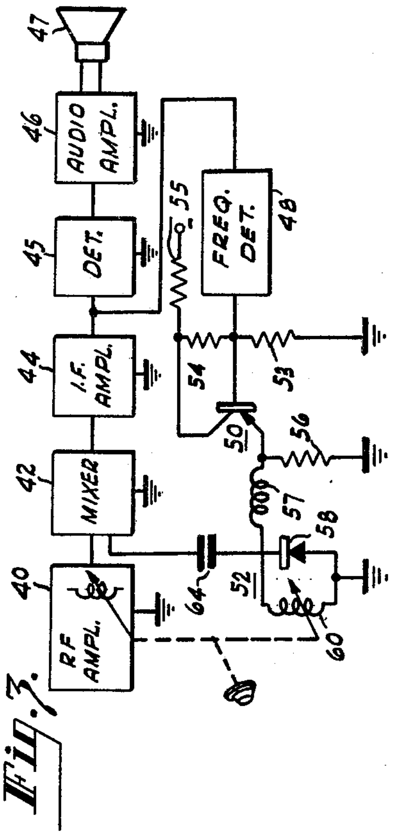
FIGURE 3 is a schematic circuit diagram of a super-heterodyne signal receiver, partially in block form, including a frequency controlled local oscillator in accordance with the invention.

Due to the negative resistance presented by the diode, an oscillation generator may be constructed which is suitable for use as the local oscillator of the superheterodyne-receiver such as a broadcast receiver. A superheterodyne receiver including a negative resistance diode local oscillator is shown in FIGURE 3. By way of example, this receiver comprises a suitable radio frequency amplifier 40, and a signal mixer 42 for heterodyning a selected signal modulated radio frequency wave with a locally generated oscillator wave to derive an intermediate frequency (I.-F.) signal. The I.-F. signal output of the signal mixer 42 is applied to a suiatble I.-F. amplifier 44 for further amplification before being applied to a detector 45, which in the case of amplitude modulation (AM) broadcast receivers may comprise a simple envelope detector. The signal output from the detector 45 comprises the modulation information of the received carrier and is applied to an audio amplifier 46 which is coupled to a loudspeaker 47.

The signal appearing at the output circuit of the I.-F. amplifier 44 is applied to a suitable frequency detector 48 which is operable to derive a control voltage, the magnitude and polarity of which are a function of the extent and direction of deviation of the I.-F. signal from a desired center frequency. This control voltage, which may be referred to as an automatic frequency control (AFC) voltage, is applied to a transistor amplifier circuit 50 which is coupled to a negative resistance diode oscillator circuit 52.

A voltage divider including the resistors 53, 54 and 55, connected between the negative terminal of an operating potential supply and ground, developes a D.-C. voltage for biasing the transistor to the proper operating point. The resistor 54 provides a D.-C. feedback to stabilize the transistor circuit operation against variations in temperature, supply voltage variations, and the like. Current flowing through the transistor causes a D.-C. voltage to be developed across a resistor 56 which is connected between the transistor emitter and ground.

This D.-C. voltage is applied through a radio-frequency choke coil 57 to a negative resistance diode 58 which may, for example, be of the type described in the aforesaid article by H. S. Sommers. The capacity presented by the diode 58 is tuned to the desired operating frequency by a tuning inductor 60. The tuning inductor 60, which may be of adjustable inductance or comprise one of a plurality of inductors of a switch type tuner, is ganged for unicontrol operation with a tuning inductor 62 included in signal selection circuits of the radio frequency amplifier 40. The oscillatory wave produced by the negative resistance diode oscillator 52 is applied to the signal mixer 42 through an oscillation injection capacitor 64.

In order to sustain oscillations continuously in the negative resistance diode circuit the two main conditions which must be satisfied are that the diode must be stably biased to exhibit a negative conductance, and the absolute value of the negative conductance of the diode must exceed the effective positive conductance of the load appearing across the diode terminals. In the circuit of FIGURE 3, the loading on the oscillator circuit is primarily due to the mixer circuit 42.

The operating parameters of the amplifier 50 are selected so that the voltage developed across the resistor 56 is of the proper value to bias the diode to exhibit a negative resistance. In order that the diode 58 be stably biased, the resistance value of the resistor 56 must be less than the absolute value of the negative resistance presented by the diode 58, as explained hereinbefore. The radio frequency choke coil 57 is provided to prevent undesirable loading of the oscillator tank circuit by the biasing circuit.

For proper superheterodyne receiver operation, the oscillator signal frequency should differ from the frequency of the selected R.-F. signal by a frequency equal to the receiver I.-F. If the oscillator circuit 52 does not operate at the proper frequency, then the frequency of the resulting I.-F. signal is not correct. When the I.-F. signal is not at the correct center frequency, the D.-C., or AFC, voltage at the output of the frequency detector 48 changes by an amount related to the extent that the I.-F. differs from the desired center frequency. The polarity or direction of the voltage change at the output of the frequency detector is a function of the direction in which the I.-F. wave departs from the desired center frequency.

The AFC voltage controls the current flow through the transistor amplifier 50 which in turn controls the D.-C. voltage developed across the resistor 56. An optional feature of the invention is that the parameters of the transistor amplifier 50 may be selected so that the diode 58 is biased out of the negative resistance region of its operating characteristic in response to AFC voltages corresponding to I.-F. signals which depart from the desired center frequency by more than a predetermined amount. In other words, the voltage developed across the resistor 56 in response to large deviations of the I.-F. carrier is sufficient to bias the diode 58 in the positive resistance region of its characteristic. Such a feature is particularly useful in exalted carrier receivers. However, if desired, the amplifier 50 may be designed to maintain the diode biased in its negative resistance region over the full range of AFC voltages which may be developed by the frequency detector 48. It has been found that variations in the control voltage applied to the diode 58 from the resistor 56 may causes frequency of operation of the negative resistance oscillator 52 to vary over a range of frequencies. This variation appears to be due to a change of capacitance of the diode as a function of the applied voltage. Thus, the AFC voltage derived by the frequency detector 48 and translated by the transistor amplifier 50 causes the frequency of the negative resistance oscillator circuit to vary in a direction to correct for errors in tuning of the local oscillator circuit, and thus tends to correct errors in the frequency of the I.-F. signal produced at the output of the mixer circuit 42.

Figure 4:
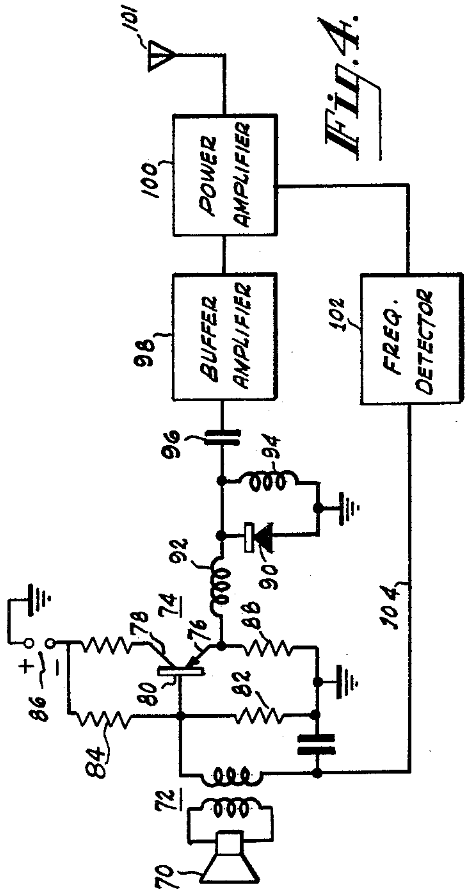
FIGURE 4 is a schematic circuit diagram, partially in block form, of an FM transmitter including a frequency controlled exciter circuit embodying the invention.

FIGURE 4 is a schematic circuit diagram of an FM transmitter circuit having an exciter comprising a negative resistance oscillator circuit embodying the invention. The FM transmitter circuit includes a microphone 70 which is coupled by a transformer 72 to the input circuit of a transistor amplifier 74. The amplifier 74 includes a transistor having an emitter 76, a collector 78, and a base 80. The base of the transistor 80 is biased at the desired D.-C. voltage by a voltage divider comprising a pair of resistors 82 and 84 which are connected between ground and the negative terminal of an operating potential supply 86, the positive terminal which is grounded. The emitter 76 of the transistor amplifier is connected to ground through a resistor 88, across which is developed a control voltage for controlling the operating of the negative resistance diode which forms the active element of the oscillator portion of exciter circuit.

Signals from the microphone 70 are applied between the base 80 and emitter 76 of transistor amplifier and are translated to produce corresponding signals across the resistor 88. The resistor 88 is coupled to a negative resistance diode 90 through a radio frequency choke coil 92 which prevents the transistor circuit from loading the oscillator circuit.

The diode 90 is tuned to the desired frequency of operation by a tuning coil 94 connected in parallel therewith. To sustain oscillations, the total positive load conductance presented to the negative resistance diode 90 must not exceed the negative conductance exhibited by the diode. Oscillations generated in the circuit including the diode 90 and the inductor 94 are coupled through a coupling capacitor 96 to a buffer amplifier 98 of any suitable design. From the buffer amplifier 98 the signals are applied to a power amplifier 100 and then to a transmitting antenna 102.

Signals from the power amplifier 100 are applied to a frequency detector 102 to develop a control, or AFC, voltage the polarity and amplitude of which are functions of the direction and extent that the transmitter carrier signal departs from a desired center frequency.

The developed AFC voltage is applied by a way of conductor 104 to the base 80 of the transistor amplifier 74 to control the voltage developed across the resistor 88.

In operation, audio signals developed by the microphone 70, which may, for example, comprise a dynamic microphone, are applied to the input electrodes of the transistor amplifier 74 to cause corresponding audio signals to be developed across the resistor 88. These audio signals are coupled through the radio frequency choke coil 92 to the diode 90 causing the capacitance thereof to vary, hence causing the frequency of oscillation to vary. In other words, the resulting carrier oscillation is frequency modulated by the audio frequency signals. As mentioned above in connection with FIGURE 3, the diode is stably biased in the negative resistance region of its characteristic by proper selection of the transistor amplifier components.

If the center frequency of the carrier wave should depart from the desired center value, the AFC voltage developed by the frequency detector 102 caused a D.-C. control voltage to be fed to the base of the transistor amplifier 74. This voltage causes a change in the average D.-C. voltage developed across the resistor 88 and hence a change in the center frequency of the oscillations produced by the negative resistance oscillator circuit.

I claim:

1. An oscillation generator comprising, in combination, a negative resistance diode having an interelectrode reactance responsive to a control voltage, reactive circuit means coupled to said diode to resonate with said reactance at a predetermined frequency, biasing circuit means connected to said diode to provide an electrical control voltage for stably biasing said diode to exhibit a negative resistance, and means electrically coupled to said biasing circuit means and responding to deviations from said predetermined frequency by developing a voltage for changing said electrical control voltage to control the frequency of oscillation of said oscillation generator.

2. An oscillation generator comprising, in combination, a voltage controlled negative resistance diode having an interelectrode capacitance responsive to a control voltage, inductive circuit means connected in parallel with said diode to tune said interelectrode capacitance to a predetermined frequency of operation, means providing a load circuit coupled to the circuit comprising said diode and inductive circuit means, the positive conductance of said load circuit effectively appearing in parallel with said diode being less than the absolute value of the negative conductance exhibited by said diode, biasing circuit means connected to said diode to provide a control voltage for stably biasing said diode to exhibit a negative resistance, and frequency responsive means coupled to said biasing circuit means and said diode, said frequency responsive means responding to deviations from said predetermined frequency by developing a voltage for application to said biasing circuit means for changing said control voltage to control the frequency of oscillation of said oscillation generator.

3. An oscillation generator comprising, in combination, a voltage controlled negative resistance diode having an interelectrode capacitance responsive to a control voltage, inductive circuit means connected in parallel with said diode to tune said interelectrode capacitance to a predetermined frequency of operation, means providing a load circuit coupled to the circuit comprising said diode and inductive circuit means, biasing circuit means connected to said diode to provide a control voltage for biasing said diode to exhibit a negative resistance, the positive direct current resistance of said biasing circuit means being less than the negative resistance of said diode so that said diode is stably biased in the negative resistance region of its characteristic, the positive conductance of said load circuit and biasing circuit effectively appearing in parallel with said diode being less than the absolute value of the negative conductance exhibited by said diode to sustain oscillation, and frequency responsive means coupled to said biasing circuit means and said parallel combination of said diode and said inductance circuit means, said frequency responsive means responding to deviations from said predetermined frequency by developing a voltage for application to said biasing circuit means to change the control voltage applied to said diode for controlling the frequency of oscillation of said oscillation generator.

4. An oscillation generator as defined in claim 3 wherein a radio frequency choke coil connects said diode to said biasing circuit means.

5. An oscillation generator comprising in combination, a voltage controlled negative resistance diode having an interelectrode capacitance responsive to a control voltage, inductive circuit means connected in parallel with said diode to tune said interelectrode capacitance to a predetermined frequency of operation, means providing a load circuit coupled to the circuit comprising said diode and inductive circuit means, the positive conductance of said load circuit effectively appearing in parallel with said diode being less than the absolute value of the negative conductance exhibiter by said diode, means providing a frequency responsive control voltage source coupled to the parallel combination of said diode and said inductance circuit means, an amplifying device having input, output, and common electrodes, means for further coupling said frequency responsive control voltage source between said input and common electrodes, a load impedance element having a greater conductance than the absolute value of the negative conductance of said diode and being connected between said output and common electrodes, means for biasing said amplifying device to cause a voltage to be developed across said impedance element the amplitude of which varies with said frequency responsive control voltage and is of a value to bias said diode in the negative resistance region of its operating characteristic, means connecting said diode in parallel with said load impedance element to receive a biasing voltage therefrom.

6. An oscillation generator comprising in combination, a voltage controlled negative resistance diode having an interelectrode capacitance responsive to a control voltage, inductive circuit means connected in parallel with said diode to tune said interelectrode capacitance to a predetermined frequency of operation, means providing a load circuit coupled to the circuit comprising said diode and inductive circuit means, the positive conductance of said load circuit effectively appearing in parallel with said diode being less than the absolute value of the negative conductance exhibited by said diode, means providing a frequency responsive control voltage source coupled to the parallel combination of said inductance circuit means and said diode, a transistor having emitter, base and collector electrodes, means for coupling said frequency responsive control voltage source between said base and emitter electrodes, a resistor having a smaller positive resistance than the negative resistance of said diode connected between said emitter electrode and ground, means for biasing said transistor to cause a voltage to be developed across said resistor the amplitude of which varies with said frequency responsive control voltage and is of a value to bias said diode in the negative resistance region of its operating characteristic, means connecting said diode in parallel with said resistor to receive a biasing voltage therefrom.

7. A superheterodyne receiver comprising the combination of an input circuit for selecting a signal modulated radio frequency carrier wave, a signal mixer coupled to said input circuit for heterodyning said radio frequency carrier wave with a locally generated oscillator signal to derive an intermediate frequency signal, an intermediate frequency amplifier coupled to said signal mixer for amplifying said intermediate frequency signal; a frequency detector coupled to said intermediate frequency amplifier for deriving an automatic frequency control voltage the amplitude of which varies as a function of the extent and direction of deviation of said intermediate frequency signal from a predetermined center frequency, a local oscillator including a negative resistance diode having an interelectrode capacitance, inductive circuit means connected in parallel with said diode to tune said interelectrode capacitance to a predetermined frequency of operation, and means for applying said automatic frequency control voltage to said diode to bias said diode in the negative resistance region of its operating characteristic, in accordance with variations of said automatic frequency control voltages.

8. A superheterodyne receiver comprising in combination, a tunable input circuit for selecting any one of a plurality of signal modulated radio frequency carrier waves, a signal mixer circuit coupled to said input circuit for heterodyning a selected radio frequency carrier wave with a locally generated oscillator wave to derive an intermediate frequency signal, an intermediate frequency amplifier circuit coupled to said signal mixer circuit, frequency detector circuit means coupled to said intermediate frequency amplifier circuit for developing a voltage as a function of the direction and extent that said intermediate frequency signal departs from a predetermined center frequency, a transistor amplifier coupled to said frequency detector circuit means, said transistor amplifier including a transistor device having base, emitter and collector electrodes, means for applying the voltage developed by said frequency detector circuit means between said emitter and base electrodes, a resistive load impedance element connected between said emitter and said collector electrodes for developing a voltage corresponding to the voltage developed by said frequency detector circuit means, an oscillator circuit for developing a locally generated oscillator wave for application to said signal mixer circuit, said oscillator circuit including a negative resistance diode having an interelectrode capacitance, an inductor connected in parallel with said diode and selected to resonate with the interelectrode capacitance of said diode at a frequency which differs from the frequency of a selected radio frequency carrier wave by an amount equal to the receiver intermediate frequency, means including a radio frequency choke coil connecting said diode in parallel with said resistive load impedance element, the positive conductance of said resistive load impedance element being selected to be less than the absolute value of the negative conductance of said diode and means for biasing said transistor device so that the voltage developed across said resistive impedance element is of a value to bias said diode in the negative resistive region of its operating characteristic.

9. A superheterodyne receiver as defined in claim 8 wherein the parameters of said transistor amplifier circuit are selected so that said negative resistance diode is biased to exhibit a positive resistance when the frequency of said intermediate frequency signal departs by more than a predetermined amount from said predetermined center frequency.

10. A superheterodyne receiver comprising in combination, a tunable input circuit for selecting any one of a plurality of signal modulated radio frequency carrier waves, a signal mixer circuit coupled to said input circuit for heterodyning a selected radio frequency carrier wave with a locally generated oscillator wave to derive an intermediate frequency signal, an intermediate frequency amplifier circuit coupled to said signal mixer circuit, frequency detector circuit means coupled to said intermediate frequency amplifier circuit for developing a voltage as a function of the direction and extent that said intermediate frequency signal departs from a predetermined center frequency, an oscillator circuit for developing a locally generated oscillator wave for application to said signal mixer circuit, said oscillator circuit including a negative resistance diode having an interelectrode capacitance, an inductor connected in parallel with said diode and selected to resonate with the interelectrode capacitance of said diode at a frequency which differs from the frequency of a selected radio frequency carrier wave by an amount equal to the receiver intermediate frequency, means for applying the voltage developed by said frequency detector circuit to said diode such that said diode is biased to exhibit a negative resistance for departures of said intermediate frequency from said predetermined center frequency and thereby cause said oscillator circuit to produce an oscillatory wave the frequency of which is a function of said control voltage.

11. A superheterodyne receiver comprising in combination, a tunable input circuit for selecting any one of a plurality of signal modulated radio frequency carrier waves, a signal mixer circuit coupled to said input circuit for heterodyning a selected radio frequency carrier wave with a locally generated oscillator wave to derive an intermediate frequency signal, an intermediate frequency amplifier circuit coupled to said signal mixer circuit, frequency detector circuit means coupled to said intermediate frequency amplifier circuit for developing a voltage as a function of the direction and extent that said intermediate frequency signal departs from a predetermined center frequency, an oscillator circuit for developing a locally generated oscillator wave for application to said signal mixer circuit, said oscillator circuit including a negative resistance diode having an interelectrode capacitance, an inductor connected in parallel with said diode and selected to resonate with the interelectrode capacitance of said diode at a frequency which differs from the frequency of a selected radio frequency carrier wave by an amount equal to the receiver intermediate frequency, means for applying the voltage developed by said frequency detector circuit to said diode such that said diode is biased to exhibit a negative resistance for departures of said intermediate frequency from said predetermined center frequency and thereby cause said oscillator circuit to produce an oscillatory wave the frequency of which is a function of said control voltage and such that said diode is biased to exhibit a positive resistance when the frequency of said intermediate frequency signal departs by more than a predetermined amount from said predetermined center frequency.

12. A frequency modulator comprising the combination of a voltage controlled negative resistance diode, an inductor connected with said diode and selected to resonate with the interelectrode capacitance of said diode at a predetermined frequency, biasing means connected to said diode to apply a voltage thereto of a magnitude to cause said diode to operate in the negative resistance region of its operating characteristic, the positive resistance exhibited by said biasing means being less than the absolute value of the negative resistance of said diode, means providing a modulating signal source coupled to said diode to vary the bias impressed thereon, and utilization means coupled with said diode, the positive conductance of said utilization means being less than the absolute value of the negative conductance of said diode.

13. A frequency modulator comprising the combination of a voltage controlled negative resistance diode, an inductor connected with said diode and selected to resonate with the interelectrode capacitance of said diode at a predetermined frequency, means providing a source of modulating signals, a transistor amplifier device including base, emitter and collector electrodes, means for applying modulating signals from said source between said base and emitter electrodes, a resistive output impedance element connected between said emitter and collector electrodes for developing across said element a voltage corresponding to the modulating signal, means applying the said voltage developed across said resistive output impedance element to said diode, means for biasing said transistor device so that the voltage developed across said resistive impedance element is of a value to bias said diode in the negative resistance region of its operating characteristic, and utilization means coupled with said diode, the positive conductance of said utilization means being less than the negative conductance of said diode.

14. An oscillation generator comprising in combination, a voltage controlled negative resistance diode having an inherent interelectrode capacitance responsive to a control voltage, inductive circuit means connected in parallel with said diode to tune said inherent interelectrode capacitance to a predetermined frequency of operation, biasing circuit means connected to said diode to provide a control voltage for stably biasing said diode to exhibit a negative resistance, and means electrically coupled to said biasing circuit means and said diode and responding to deviations from said predetermined frequency of operation for developing a voltage for changing said control voltage to control the frequency of oscillation of said oscillation generator.

References Cited in the file of this patent

UNITED STATES PATENTS

| | | |
|---|---|---|
| 2,233,777 | Foster | Mar. 4, 1941 |
| 2,469,569 | Ohl | May 10, 1949 |
| 2,610,318 | Clark | Sept. 9, 1952 |
| 2,683,861 | Vierling et al. | July 13, 1954 |
| 2,735,011 | Dickinson | Feb. 14, 1956 |
| 2,838,671 | Miller et al. | June 10, 1958 |
| 2,896,018 | Rhodes et al. | July 21, 1959 |
| 2,898,556 | Matarese | Aug. 4, 1959 |
| 2,976,411 | Kahn | Mar. 21, 1961 |
| 2,979,610 | Beucher | Apr. 11, 1961 |
| 2,986,724 | Jaeger | May 30, 1961 |

OTHER REFERENCES

Gabel: "The Crystal as a Generator and Amplifier," The Wireless World, Oct. 1, 1924, pages 2–5, Oct. 8, 1924, pages 47–50.

H. S. Sommers, Jr.: "Tunnel Diodes as High-Frequency Devices," Institute of Radio Engineers, July 1959, pages 1202–1205.